United States Patent
Mielnik et al.

(10) Patent No.: US 9,872,412 B2
(45) Date of Patent: Jan. 16, 2018

(54) RAIL-MOUNTED CONTROL SYSTEM

(71) Applicant: ABB Technology AG, Zurich (CH)

(72) Inventors: David Mielnik, Painesville, OH (US); John Piunno, Painesville, OH (US); Christopher Gammell, Solon, OH (US); Richard Ogorek, Sagamore Hills, OH (US); Mike J. Maczuzak, Bratenahl, OH (US); Krzysztof Miedza, Bay Village, OH (US); Brian Milliff, Cleveland, OH (US); Luke Hillebrecht, Ravenna, OH (US)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 15/078,582

(22) Filed: Mar. 23, 2016

(65) Prior Publication Data

US 2016/0278230 A1 Sep. 22, 2016

Related U.S. Application Data

(63) Continuation of application No. PCT/US2014/057694, filed on Sep. 26, 2014.
(Continued)

(51) Int. Cl.
*H05K 7/00* (2006.01)
*H05K 7/14* (2006.01)
*H01R 24/64* (2011.01)

(52) U.S. Cl.
CPC .......... *H05K 7/1474* (2013.01); *H01R 24/64* (2013.01); *H05K 7/1401* (2013.01)

(58) Field of Classification Search
CPC ..... H05K 7/1474; H05K 7/1401; H01R 24/64
(Continued)

(56) References Cited

U.S. PATENT DOCUMENTS

| D288,685 S | 3/1987 | Arai et al. |
| D327,868 S | 7/1992 | Oka |

(Continued)

FOREIGN PATENT DOCUMENTS

| DE | 2638118 | 3/1978 |
| DE | 29723752 | 4/1999 |

(Continued)

OTHER PUBLICATIONS

International Search Report and Written Opinion, PCT/US2014/057694, ABB Technology AG, dated Dec. 18, 2014, 7 pgs.

*Primary Examiner* — Hung S Bui
(74) *Attorney, Agent, or Firm* — Taft Stettinius & Hollister LLP

(57) ABSTRACT

A control system for mounting to a rail. The control system includes a control assembly and one or more I/O assemblies. The control assembly and each I/O assembly includes a module removably mounted to a base. The base has a body with a channel formed therein that is adapted to receive the rail. A latching assembly is mounted to the body and includes a lever movable between a latched position and an unlatched position, wherein the movement of the lever between the unlatched and latched positions moves latching members into and out of the channel, whereby when the rail is disposed in the channel and the lever is moved to the latched position, the latching members move into the channel, thereby trapping the rail in the channel and securing the base to the rail. When the module is mounted to the base, the module covers the lever of the latching assembly so as to be inaccessible.

15 Claims, 5 Drawing Sheets

Related U.S. Application Data

(60) Provisional application No. 61/883,008, filed on Sep. 23, 2013.

(58) Field of Classification Search
USPC .............. 361/747, 756, 759, 801–802, 825
See application file for complete search history.

(56) References Cited

U.S. PATENT DOCUMENTS

| | | | |
|---|---|---|---|
| D360,413 S | 7/1995 | Kawazoe et al. | |
| D362,445 S | 9/1995 | McClain et al. | |
| D368,266 S | 3/1996 | McClain et al. | |
| D375,084 S | 10/1996 | Hamada | |
| D413,572 S | 9/1999 | Byrd et al. | |
| 5,984,734 A | 11/1999 | Piper et al. | |
| 6,185,095 B1 | 2/2001 | Helot et al. | |
| 6,257,936 B1* | 7/2001 | Strandberg | H01R 31/005 439/715 |
| 6,371,435 B1 | 4/2002 | Landis et al. | |
| 6,431,909 B1* | 8/2002 | Nolden | H01R 9/2608 361/735 |
| 6,456,495 B1 | 9/2002 | Wieloch et al. | |
| D468,258 S | 1/2003 | Guo et al. | |
| 6,840,819 B2* | 1/2005 | Bet | H02B 1/052 439/157 |
| D525,197 S | 7/2006 | Tanabe et al. | |
| D532,378 S | 11/2006 | Kesler | |
| 7,516,927 B2* | 4/2009 | Portal | H01R 9/2608 248/221.11 |
| D605,119 S | 12/2009 | Pape et al. | |
| D605,120 S | 12/2009 | Pape et al. | |
| D609,195 S | 2/2010 | Yamashita et al. | |
| D617,273 S | 6/2010 | Sakai | |
| D626,958 S | 11/2010 | Jardine et al. | |
| 8,226,433 B1* | 7/2012 | Correll | H01R 9/2608 439/532 |
| D666,971 S | 9/2012 | Sekine et al. | |
| D669,855 S | 10/2012 | Correll et al. | |
| D679,712 S | 4/2013 | McParland et al. | |
| 8,472,194 B2 | 6/2013 | Hernandez et al. | |
| D735,667 S | 8/2015 | Mielnik et al. | |
| D739,353 S | 9/2015 | Mielnik et al. | |
| D766,182 S | 9/2016 | Mielnik et al. | |
| 9,454,140 B2* | 9/2016 | Godau | H01R 9/2458 |
| 9,485,879 B2* | 11/2016 | Molnar | H05K 5/0026 |
| 9,545,027 B2* | 1/2017 | Chiang | H05K 7/12 |
| 2006/0104024 A1 | 5/2006 | Wang et al. | |
| 2010/0268850 A1* | 10/2010 | Burton | G06F 13/409 710/3 |
| 2012/0181866 A1 | 7/2012 | Abert | |
| 2013/0027890 A1* | 1/2013 | Berger | H05K 7/1468 361/747 |
| 2014/0177170 A1 | 6/2014 | Steffen | |
| 2016/0041609 A1 | 2/2016 | Apro | |

FOREIGN PATENT DOCUMENTS

| | | |
|---|---|---|
| DE | 10249981 | 4/2004 |
| DE | 19748530 | 9/2004 |
| EP | 2073618 | 6/2009 |
| EP | 2736062 | 5/2014 |
| JP | 2902213 | 6/1999 |
| WO | 0062385 | 10/2000 |
| WO | 2013054873 | 4/2013 |

* cited by examiner

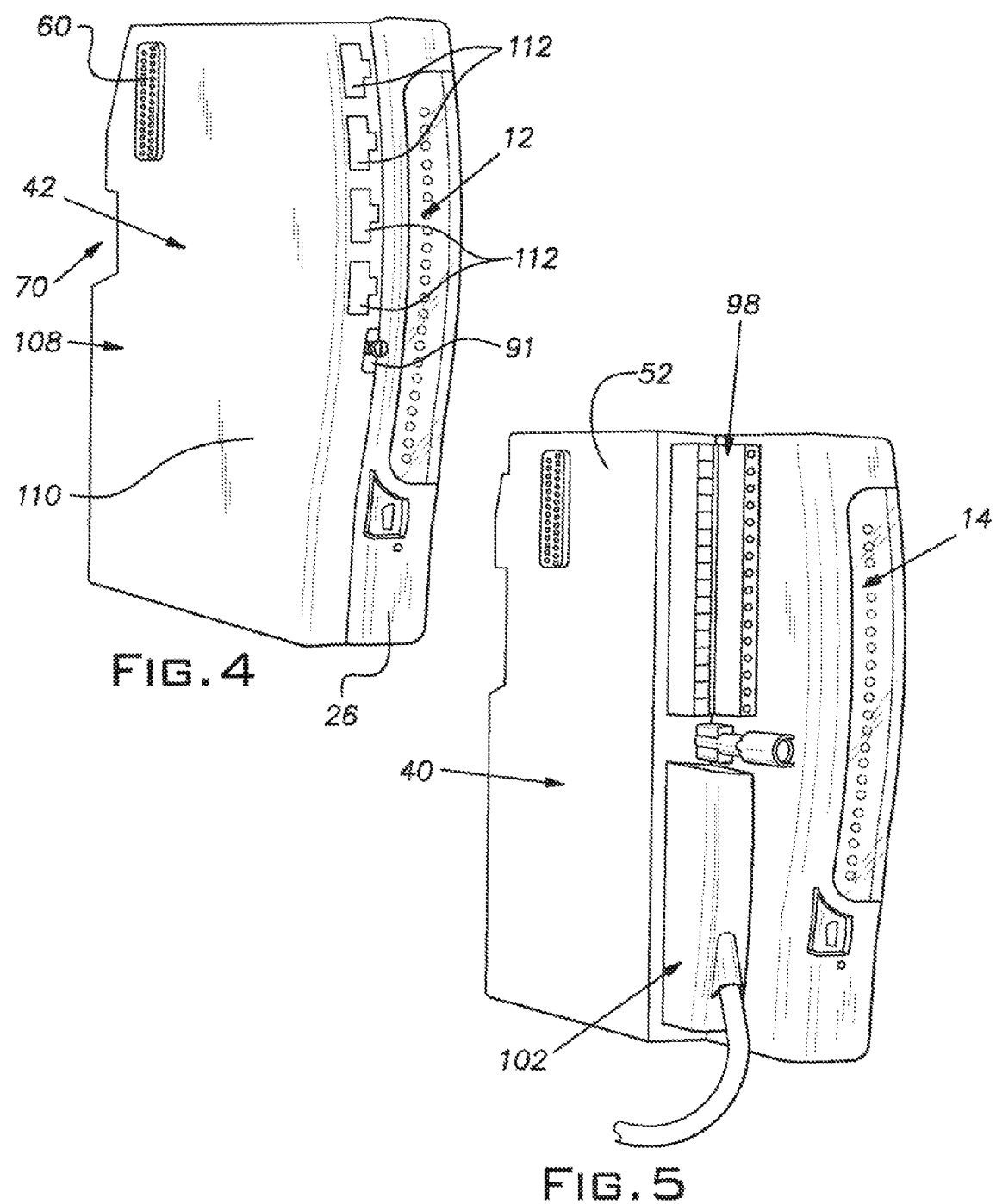

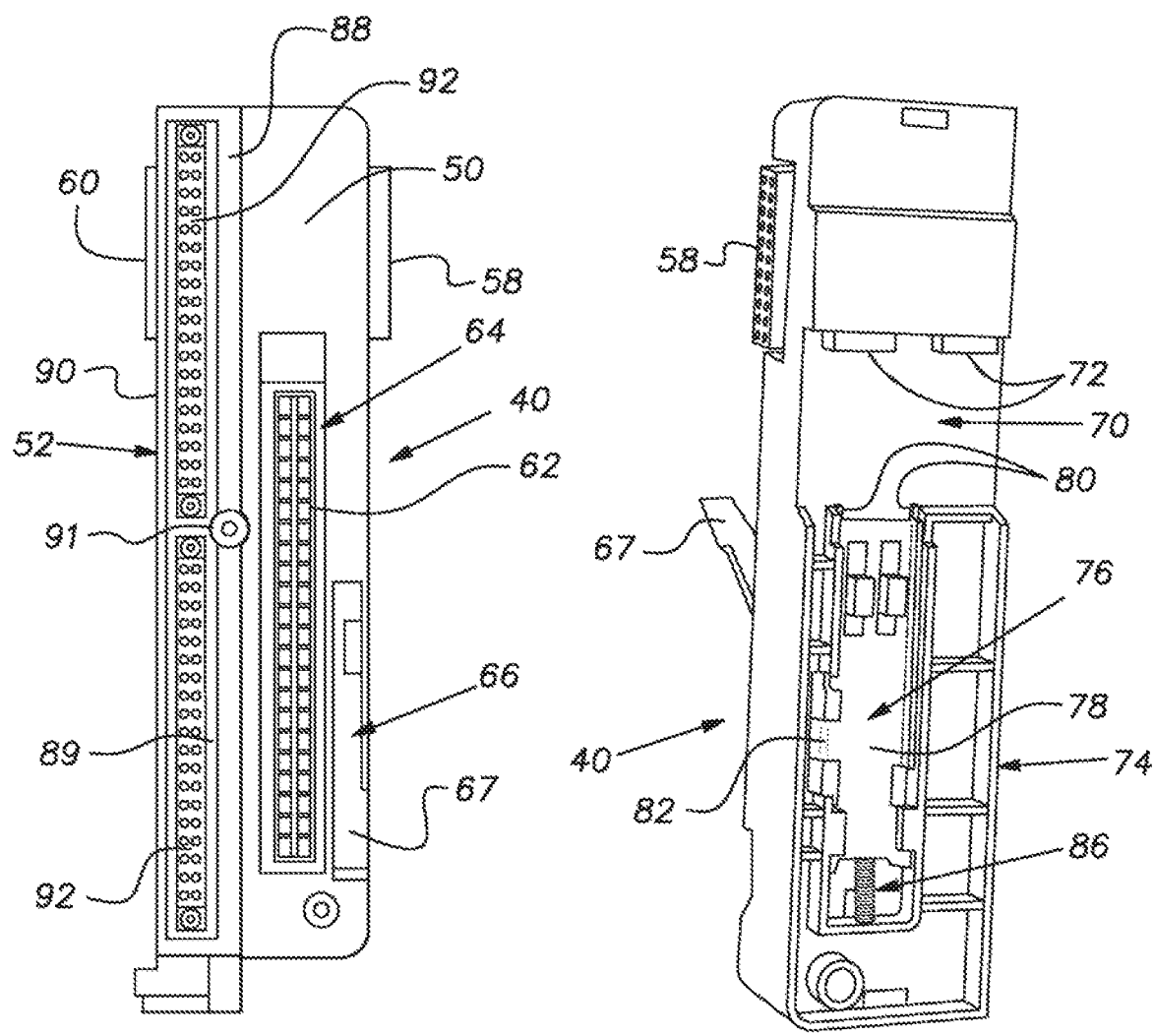
FIG. 6
FIG. 8
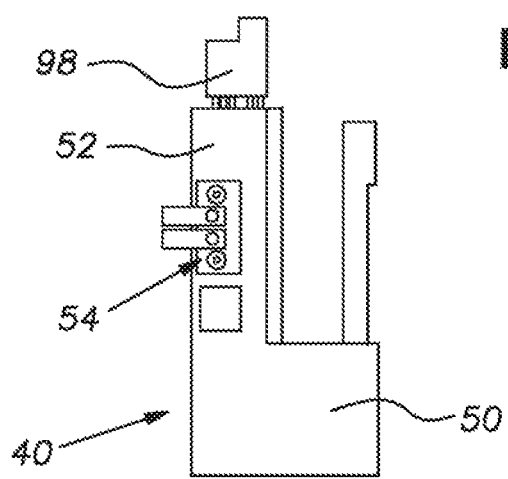
FIG. 7

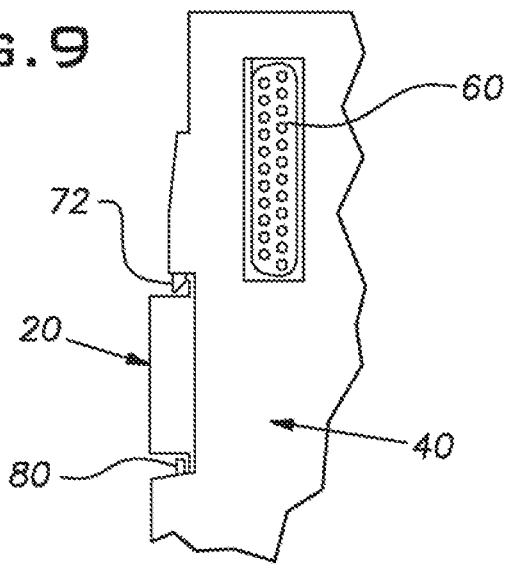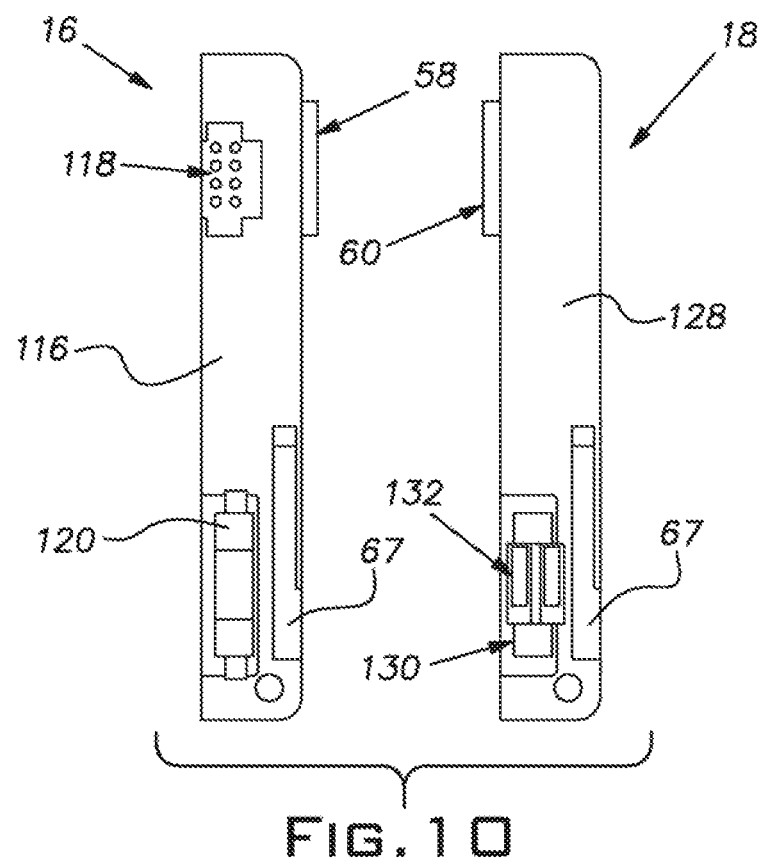

RAIL-MOUNTED CONTROL SYSTEM

BACKGROUND OF THE INVENTION

The present invention relates to industrial control systems and more particularly to industrial control systems having rail-mounted controller and input/output modules.

Industrial control systems, such as distributed control systems, often include one or more controllers that utilize input signals from field devices, such as flow meters, to provide control output signals to final control elements, such as valves, in order to control a process or one or more sub-processes. Such control systems are typically module-based and include one or more controller modules and one or more input/output (I/O) modules through which the controller module receives and sends input and output signals from and to the field, respectively. The controller module and I/O modules are often mounted to a rail, such as a DIN rail.

Rail-mounted control systems must have a flexible design that permits different types and numbers of I/O modules to be connected together with the controller module. In addition, the design should permit modules to be mounted to and removed from the rail in a relatively simple manner. However, this simplicity must be balanced with the need to keep the modules securely fastened to the rail. This balance is often not achieved with conventional rail-mounted control systems.

The present invention is directed to a rail-mounted control system having improved features, including an improved module mounting feature.

SUMMARY OF THE INVENTION

In accordance with the present invention, a control system is provided for mounting to a rail. The control system includes a base having a body and a latching assembly. The body has a channel formed therein that is adapted to receive the rail. The latching assembly is mounted to the body and includes a movable lever and at least one latching member. The lever is movable between a latched position and an unlatched position, wherein the movement of the lever between the unlatched and latched positions moves the at least one latching member into and out of the channel, whereby when the rail is disposed in the channel and the lever is moved to the latched position, the at least one latching member moves into the channel, thereby trapping the rail in the channel and securing the base to the rail. A module is provided for removable mounting to the base. The module includes circuitry for processing control signals. When the module is mounted to the base, the module covers the lever of the latching assembly so as to be inaccessible.

BRIEF DESCRIPTION OF THE DRAWINGS

The features, aspects, and advantages of the present invention will become better understood with regard to the following description, appended claims, and accompanying drawings where:

FIG. 4 shows a front perspective view of a control assembly of the control system;

FIG. 5 shows a front perspective view of the I/O assembly;

FIG. 6 shows a front view of an I/O base of the I/O assembly;

FIG. 7 shows a bottom end view of the I/O base;

FIG. 8 shows a rear perspective view of the I/O base;

FIG. 9 shows a partial side view of the I/O base mounted to the rail; and

FIG. 10 shows first and second end modules of the control system.

DETAILED DESCRIPTION OF ILLUSTRATIVE EMBODIMENTS

Figure 1:
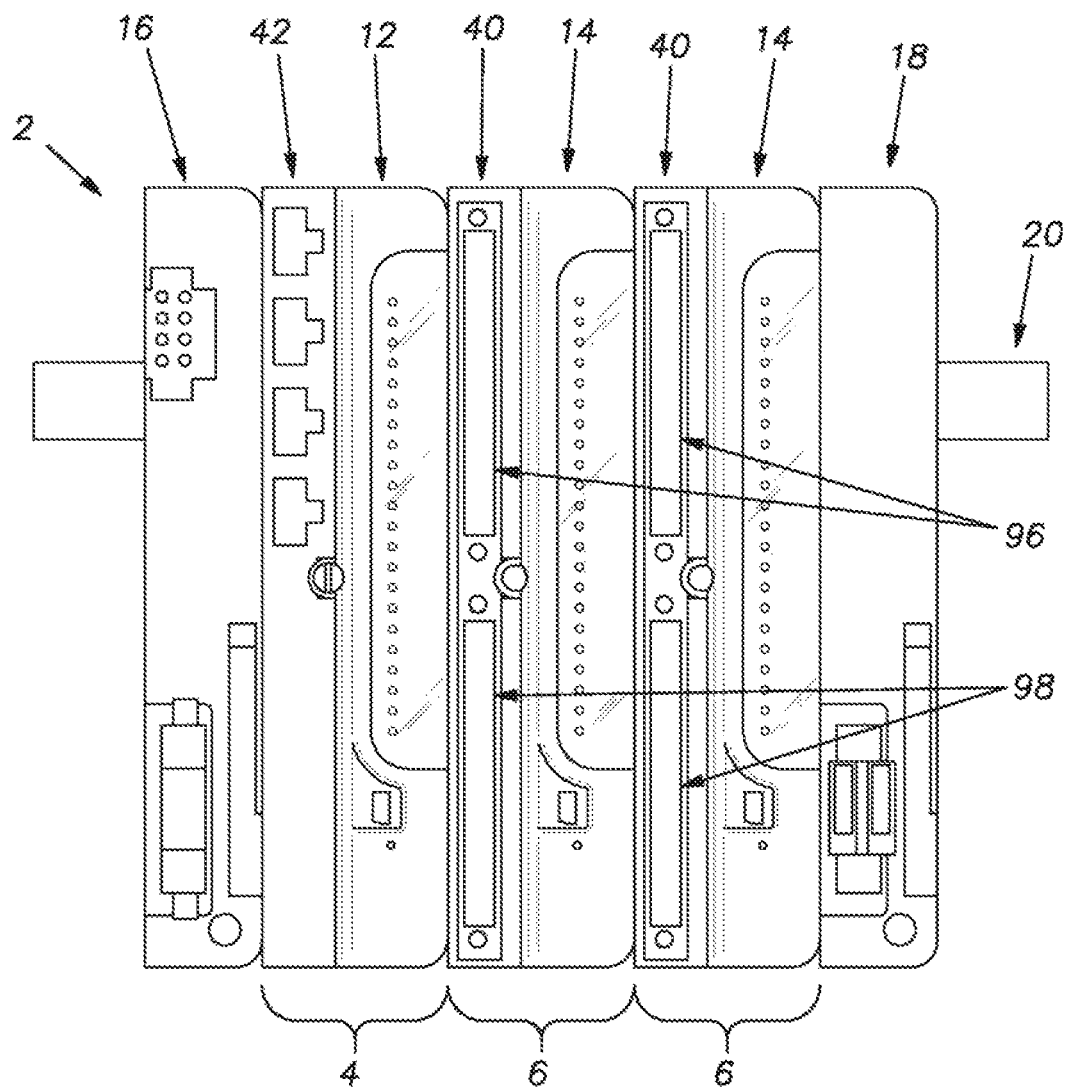
FIG. 1 shows a front view of a control system mounted to a rail.

It should be noted that in the detailed description that follows, identical components have the same reference numerals, regardless of whether they are shown in different embodiments of the present invention. It should also be noted that in order to clearly and concisely disclose the present invention, the drawings may not necessarily be to scale and certain features of the invention may be shown in somewhat schematic form.

Referring now to FIG. 1, there is shown a module row 2 of a node of an industrial control system. The module row 2 comprises a controller assembly 4, a plurality of I/O assemblies 6 and first and second end modules 16, 18 mounted to a top hat DIN rail 20. The node may include one or more additional module rows comprising one or more I/O assemblies 6 and first and second end modules 16, 18. Each additional module row may be mounted to a separate DIN rail. The node may be used to control all or a portion of an industrial process, such as a power generation process. Further, the node may be connected to other nodes of the industrial control system, as described more fully below.

Figure 2:
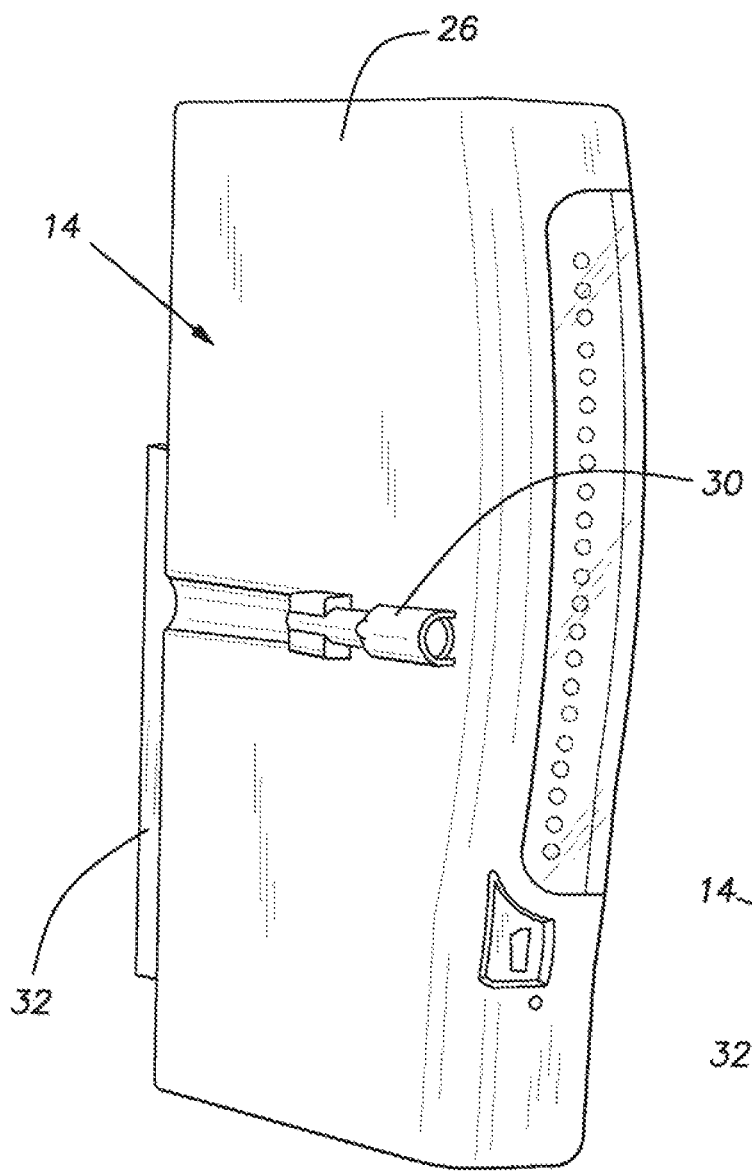
FIG. 2 shows front perspective view of an I/O module of an I/O assembly of the control system.
Figure 3:
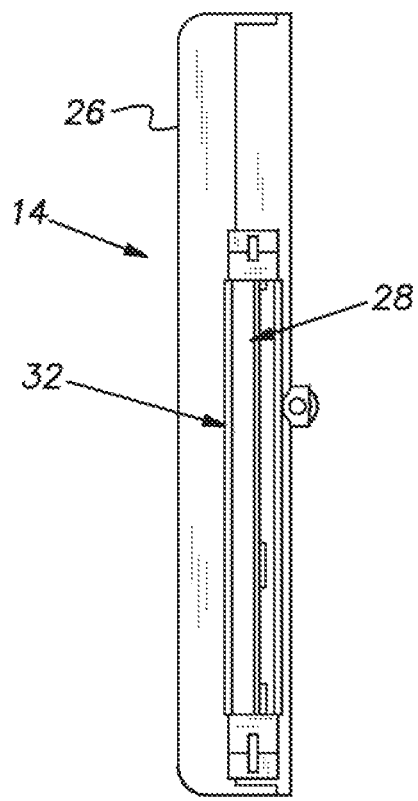
FIG. 3 shows a rear view of the I/O module.

Each I/O assembly 6 comprises an I/O module 14 releasably mounted to an I/O base 40. With particular reference now to FIGS. 2 and 3, each I/O module 14 includes a two-piece plastic housing 26 enclosing a circuit board 28. A generally cylindrical mount 30 is joined to a side wall of the housing 26. A bore extends axially through the mount 30. The housing 26 defines a rear plug 32 within which is disposed a connecting portion of the circuit board 28. Circuitry on the circuit board 28 processes field inputs received from sensors in the field or control outputs received from the controller module 12, depending on whether the I/O module 14 handles inputs or outputs. More specifically, the circuitry converts between field signals (e.g., analog 4-20 mA, digital 24VDC etc.) and digital controller signals, such as by using analog-to-digital and/or digital-to-analog converters. The circuitry also conditions the signals received from or going to the field, such as by using switches, filters and multiplexers, and isolates the field signals from the controller modules 12.

Each I/O assembly 6 handles a plurality of inputs or a plurality of outputs. A typical control system has one or more I/O assemblies 6 handling inputs and one or more I/O assemblies 6 handling outputs. The inputs may be analog inputs, digital inputs, thermocouple inputs or RTD inputs. The outputs may be analog outputs or digital outputs. The inputs and outputs (I/O) are typically powered by the sensors and control elements in the field. However, digital outputs may be powered by the I/O assembly 6, such as when the digital outputs are used to energize relay coils.

Referring now also to FIG. 4, the controller assembly 4 includes a controller module 12 releasably mounted to a controller base 42. The controller module 12 has a construction similar to each I/O module 14 and includes a circuit board mounted inside a housing 26 with a mount 30 (not shown for the controller module 12) joined thereto. The circuit board includes a microprocessor, memory and other circuitry. The memory stores control programs that are executed by the microprocessor. The control programs include one or more control loops, such as PID loops, which work on one or more field inputs to generate control outputs. The field inputs and control outputs are routed to and from the controller assembly 4 through the I/O assemblies 6 via a module communication bus, which extends through and is formed by the I/O bases 40.

As set forth above, each of the I/O modules 14 is mounted to an I/O base 40. The I/O bases 40 are adapted for releasably secure mounting to the DIN rail 20.

Referring now to FIGS. 5-7, each I/O base 40 is generally L-shaped, having a side portion 52 extending outwardly at about a right angle from a mounting portion 50. The mounting portion 50 has front and rear sides, first and second lateral sides and top and bottom ends. A power connector 54 is secured within the side portion 52 and is accessible through the bottom end. The power connector 54 is adapted for connection to a supply of power (e.g. 24VDC) for powering digital outputs, as described above.

First and second pin connectors 58, 60 are secured to, and extend from, the first and second lateral sides, respectively. The first and second pin connectors 58, 60 are connected together inside the mounting portion 50 and help form the module communication bus, as well as a module power bus. The first pin connector 58 of an I/O base 40 is adapted to engage and connect to a second pin connector 60 of another, adjacent I/O base 40. In this manner, a plurality of I/O bases 40 may be connected together to form a series of I/O bases 40 through which the module bus and the power bus extend.

An enlarged opening, generally rectangular in shape, extends through the front side and into the interior of the mounting portion 50. A circuit board connector 62 is disposed inside the mounting portion and is accessible through the enlarged opening. The enlarged opening and connector 62 form a socket 64 for receiving the plug and the connecting portion of the circuit board 28 of the I/O module 14. Another, smaller opening is disposed adjacent to the socket 64. The smaller opening extends through the mounting portion. An actuator 66 comprising an elongated lever 67 joined to a cam is pivotally mounted inside the smaller opening and is movable between a latched position and an unlatched position. In the latched position, the lever 67 is disposed substantially flush with the front side (as shown in FIG. 6), whereas in the unlatched position, the lever 67 extends outward from the front side (as shown in FIGS. 7 and 8).

Referring now to FIG. 8, a channel 70 is formed in the rear side of the I/O base 40. The channel 70 is adapted for receiving the DIN rail 20 and is defined, in part, by an upper edge having a pair of tabs 72 extending downwardly therefrom. A wall grid 74 is located below the channel 70 and defines a passage, within which a metallic shuttle 76 is movably mounted. The shuttle 76 is generally rectangular and includes a body 78 with a pair of outwardly-extending side flanges. The flanges extend upwardly beyond the body 78, thereby forming a pair of upwardly-protruding tangs 80. A contact arm 82 extends inwardly from the body 78 at about a right angle, into the smaller opening in the mounting portion 50. A flange on the end of the contact arm 82 engages the cam of the actuator 66. The shuttle 76 is slidably movable between an engaged position and a disengaged position. When the shuttle 76 is in the engaged position, the tangs 80 of the shuttle 76 extend into the channel 70. When the shuttle 76 is moved to the disengaged position, the tangs 80 are retracted back into the passage. A spring 86 is connected between a lower end of the shuttle 76 and a lower wall of the wall grid 74. The spring 86 biases the shuttle 76 toward the engaged position.

The cam of the actuator 66 and the contact arm 82 of the shuttle 76 are positioned and shaped such that when the actuator 66 moves between the latched and unlatched positions, the cam engages the contact arm 82 to move the shuttle 76 between the engaged and disengaged positions. More specifically, when the actuator 66 is in the latched position (and the lever 67 is flush with the front side), the shuttle 76 is in the engaged position (and the tangs 80 extend into the channel 70). When the actuator 66 is moved to the unlatched position, the shuttle 76 is moved (against the bias of the spring 86) to the disengaged position (and the tangs 80 are moved out of the channel 70).

The side portion 52 of each I/O base 40 has inner and outer walls 88, 90 that help define an elongated pocket 89. A mount 91 with a threaded bore is formed in the inner wall 88, adjacent to the pocket 89. A pair of connectors 92 are secured within the pocket 89. Each connector 92 has an elongated irregular opening that is defined, at least in part, by an undulating or sinuous internal surface. A plurality of metallic pins are mounted inside the irregular openings and are electrically connected to the circuit board connector 62 of the socket 64. The irregular openings are adapted to receive, in a plug-in type manner, plugs of a pair of terminal blocks, respectively (such as terminal blocks 96, 98). Each terminal block plug includes a plurality of crimps that engage the pins of a connector 92, respectively. In this manner, terminal blocks may be removably mounted to the I/O base 40. Screws may be used to releasably fasten the terminal blocks to mounts inside the pocket 89.

Different types of terminal blocks may be selectively mounted to the connectors 92. For example, different terminal blocks for different gauges of field wire may be mounted to the connectors 92. Also, loose wire and/or marshaling terminal blocks may be utilized. In each I/O base 40, the terminal blocks may be of the same type or may be of different types. For example, as shown in FIG. 1, one of the terminal blocks may be for a first gauge of field wire (e.g. connector 96), while the other one of the terminal blocks (e.g. connector 98) may be for a second gauge of field wire. Also, as shown in FIG. 6, a loose wire terminal block connector (e.g., connector 98) may be used with a marshaling terminal block connector (e.g., connector 102). In the marshaling terminal block connector 102, the field wiring for connection to the pins of the connector 92 are enclosed in a single cable 104 joined to a plug that is inserted into the irregular opening of the connector 92.

Referring back to FIG. 4, the controller base 42 is also generally L-shaped, having a side portion 110 extending outwardly at about a right angle from a mounting portion 108. First and second pin connectors 58, 60 are secured to, and extend from, first and second lateral sides of the mounting portion 108, respectively. The first and second pin connectors 58, 60 are connected together inside the mounting portion 108 and help form the module communication bus 20, as well as the module power bus. The first pin connector 58 of the controller base 42 is adapted to engage and connect to a second pin connector 60 of an adjacent I/O base 40. In this manner, the controller base 42 can be connected to and communicate with a series of I/O bases 40.

Similar to the I/O base 40, the controller base 42 has a socket 64 (not shown for the controller base 42) in its mounting portion 108 for receiving the plug 32 and connecting portion of the circuit board of the controller module 12. Also, similar to the I/O base 40, the controller base 42 has an actuator 66 (not shown for the controller base 42) that is operable to move a shuttle 76 between engaged and disengaged positions to move tangs into and out of a channel 70 in a rear side of the controller base 42. As in the I/O base 40, the channel 70 in the controller base 42 is adapted for receiving the DIN rail 20 and is defined, in part, by an upper edge having a pair of tabs 72 (not shown for the controller base 42) extending downwardly therefrom.

The side portion 110 of the controller base 42 has a different construction than the side portion 52 of the I/O base 40. The side portion 110 does not have a pocket formed therein like the side portion 52. However, the side portion 110 does have a mount 91. A free outer end of the side portion 110 of the controller base 42 has a contoured surface, within which a plurality of Ethernet jacks 112 are located. The Ethernet jacks 112 are adapted to receive plugs of Ethernet cables, respectively. When the controller module 12 is connected to the controller base 42 through the connecting portion of the circuit board and the socket 64, the Ethernet jacks 112 are connected to an Ethernet foreign device interface in the controller module 12. In this manner, the controller module 12 can communicate with other devices over Ethernet cables plugged into the Ethernet jacks 112. More specifically, the controller module 12 can communicate with other controller modules 12 (in other nodes) similarly connected to the Ethernet cables, and/or with operator workstations connected to the Ethernet cables. The controller 12 may use a protocol, such as Modbus TCP, to communicate with other devices connected to the Ethernet cables.

Referring now to FIG. 10, the first end module 16 has a body 116 with front and rear sides and first and second lateral sides. A power connector 118 for connection to a module power supply is mounted to the body 116 and is accessible from the front side. A communication connector 120 is also mounted to the body 116 and is accessible from the front side. A first pin connector 58 is secured to and extends from the first lateral side of the body 116. The communication connector 120 and the power connector 118 are connected to the first pin connector 58 inside the body 116. In this manner, the power connector 118 and the communication connector 120 are connected to the module communication bus and the module power bus when the first pin connector 58 of the first end module 16 is connected to the second pin connector 60 of the controller base 42. Thus, the module power supply provides power to the module bus through its connection to the power connector 118.

The first end module 16 has an actuator 66 (not shown for the first end module 16) that is operable to move a shuttle 76 between engaged and disengaged positions to move tangs into and out of a channel 70 in a rear side of the first end module 16. As in the I/O base 40, the channel 70 in the first end module 16 is adapted for receiving the DIN rail 20 and is defined, in part, by an upper edge having a pair of tabs 72 (not shown) extending downwardly therefrom.

The second end module 18 has a body 128 with front and rear sides and first and second lateral sides. A communication connector 130 is also mounted to the body 128 and is accessible from the front side. A second pin connector 60 is secured to and extends from the second lateral side of the body 128. The second pin connector 60 is connected to the module communication bus and the module power bus. The communication connector 130 permits the module row 2 to be connected to a second module row comprising first and second end modules 16, 18 and one or more I/O assemblies 6. In such an arrangement, the communication connector 130 of the second end module 18 in the module row 2 is connected by a cable to the communication connector 120 in a first end module 16 of the second module row. However, if the module row 2 is not connected to a second module row, a circuit board 132 is plugged into the communication connector 130 to close the module bus, as shown.

The second end module 18 has an actuator 66 (not shown for the second end module 18) that is operable to move a shuttle 76 between engaged and disengaged positions to move tangs into and out of a channel 70 in a rear side of the first end module 16. As in the I/O base 40, the channel 70 in the second end module 18 is adapted for receiving the DIN rail 20 and is defined, in part, by an upper edge having a pair of tabs 72 (not shown) extending downwardly therefrom.

The I/O bases 40 and the controller base 42 are mounted to the DIN rail 20 without the I/O modules 14 and the controller module 12 being mounted thereto, respectively. This is required in order to permit the levers 67 to be manually manipulated. The I/O bases 40, the controller base 42 and the first and second end modules 16, 18 are mounted to the DIN rail 20 by the same mechanism and in the same manner. Each of these devices is mounted to the DIN rail 20 by first manipulating the lever 67 so that the actuator 66 is moved to the unlatched position, thereby moving the shuttle 76 to the disengaged position, where the tangs 80 are not disposed in the channel 70. The top of each device is then tilted and the tabs 72 are inserted behind a top flange of the DIN rail 20. The device is pivoted downward to move the channel 70 over the DIN rail 20. With the DIN rail 20 disposed in the channel 70, the lever 67 is manipulated so that the actuator 66 is moved to the closed position, thereby moving the tangs 80 into the channel 70, under a bottom flange of the DIN rail 20. At this point, the top and bottom flanges of the DIN rail 20 are trapped inside the channel 70 by the tabs 72 and the tangs 80 (as shown in FIG. 9), thereby securing the device to the DIN rail 20.

Once the controller base 42 and the I/O bases 40 are mounted to the DIN rail 20 as described above, the controller module 12 and the I/O modules 14 are mounted to the controller base 42 and the I/O bases 40, respectively, by inserting the plugs 32 of the controller module 12 and the I/O modules 14 into the sockets 64 of the controller base 42 and the I/O bases 40, respectively. With the modules 12, 14 so positioned, the mounts 30 of the modules 12, 14 are aligned with the mounts 91 of the bases 42, 40, respectively. Screws are then threaded into the aligned bores of the mounts 30 and the mounts 91, respectively, thereby releasably securing the modules 12, 14 to the bases 42, 40. When the modules 12, 14 are mounted to the bases 42, 40 in the foregoing manner, the modules 12, 14 are disposed over (cover) the levers 67, thereby rendering them inaccessible. Accordingly, in order to remove the controller assembly 4 and the I/O assemblies 6 from the DIN rail 20, the controller module 12 and the I/O modules 14 must first be removed from the controller base 42 and the I/O bases 40 to provide access to the levers 67. For each base 40, 42, the lever 67 is then manipulated to move the actuator 66 to the unlatched position, thereby moving the shuttle 76 to the disengaged position, where the tangs 80 are not disposed in the channel 70. As a result, the top and bottom flanges of the DIN rail 20 are no longer trapped inside the channel 70 and the base 40, 42 may be removed from the DIN rail 20.

When the bases 42, 40 are mounted to the DIN rail 20 and the modules 12, 14 are mounted to the bases 42, 40, such as shown in FIG. 1, the terminal blocks (such as terminal blocks 96, 98 in each I/O assembly 6 are disposed to the side (laterally) of the I/O module 14 and are arranged vertically, i.e., one above the other. In addition, the terminal blocks are located inwardly (toward the DIN rail 20) from an outermost portion of the I/O module 14.

It is to be understood that the description of the foregoing exemplary embodiment(s) is (are) intended to be only illustrative, rather than exhaustive, of the present invention. Those of ordinary skill will be able to make certain additions, deletions, and/or modifications to the embodiment(s) of the disclosed subject matter without departing from the spirit of the invention or its scope, as defined by the appended claims.

What is claimed is:

1. A control system for mounting to a rail, the control system comprising:
    a base including a body formed by a mounting portion and a side portion extending outwardly from a front side of the mounting portion at about a right angle to form an L-shaped base, the side portion including an inner wall and an outer wall that define a pocket therebetween opening opposite the rail with at least one connector housed in the pocket, the mounting portion further including a circuit board connector at the front side of the mounting portion, the body having a channel formed therein that is opposite the front side and adapted to receive the rail, the base further including a latching assembly being mounted to the body that includes a movable lever and at least one latching member, the circuit board connector being located between the lever and the side portion, the lever being movable between a latched position and an unlatched position, wherein the movement of the lever between the unlatched and latched positions moves the at least one latching member into and out of the channel, whereby when the rail is disposed in the channel and the lever is moved to the latched position, the at least one latching member moves into the channel, thereby trapping the rail in the channel and securing the base to the rail; and
    a module for removable mounting to the base, the module comprising circuitry for processing control signals, wherein when the module is mounted to the base, the module covers the lever of the latching assembly so as to be inaccessible.

2. The control system of claim 1, wherein power to the module and communication to and from the module are routed through the base.

3. The control system of claim 1, wherein the module further comprises a plug and the body of the base further comprises a socket adapted to receive the plug to establish communication between the base and the module.

4. The control system of claim 3, wherein when the module is mounted to the base, the module extends outwardly from the body and is disposed laterally from the side portion.

5. The control system of claim 4, wherein the at least one connector of the side portion is for establishing communication between the base and one or more other devices.

6. The control system of claim 5, wherein the at least one connector is a terminal block for connection to ends of wires that are connected at their other ends to the one or more other devices.

7. The control system of claim 6, wherein the one or more other devices are field devices and the module is an input/output (I/O) module that processes and conditions field inputs received from the field devices or control outputs received from a controller module.

8. The control system of claim 5, wherein the module is a controller module and the connector is an Ethernet jack for receiving a plug of an Ethernet cable having another plug connected to another controller module or to an operator workstation.

9. The control system of claim 1, wherein the latching assembly further comprises a shuttle slidably mounted to a rear side of the body of the base so as to be movable in a direction perpendicular to the channel, the shuttle comprising the at least one latching member and an arm that engages the lever such that movement of the lever between the latched position and the unlatched position moves the shuttle between engaged and disengaged positions, respectively, wherein when the shuttle is in the engaged position, the at least one latching member is disposed in the channel and when the shuttle is in the disengaged position, the at least one latching member is disposed outside the channel.

10. The control system of claim 9, wherein the latching assembly further comprises a spring biasing the shuttle toward the engaged position.

11. The control system of claim 10, wherein the at least one latching member comprises a plurality of latching members.

12. The control system of claim 9, wherein when the lever is in the unlatched position, the lever extends outwardly from a front side of the base, and when the lever is in the latched position, the lever is disposed substantially flush with the front side of the base.

13. The control system of claim 1, wherein the base is a first base and the module is a first module, and wherein the control system further comprises:
    a second base including a body and a latching assembly, the body having a channel formed therein that is adapted to receive the rail, the latching assembly being mounted to the body and including a movable lever and at least one latching member, the lever being movable between a latched position and an unlatched position, wherein the movement of the lever between the unlatched and latched positions moves the at least one latching member into and out of the channel, whereby when the rail is disposed in the channel and the lever is moved to the latched position, the at least one latching member moves into the channel, thereby trapping the rail in the channel and securing the second base to the rail; and
    a second module for removable mounting to the second base, the second module containing circuitry for processing control signals, wherein when the second module is mounted to the second base, the second module covers the lever of the latching assembly so as to be inaccessible.

14. The control system of claim 13, wherein the first and second bases each further comprise plugs disposed on opposing sides of the body, wherein one of the plugs of the first base and one of the plugs of the second base are adapted to connect to each other to help form a power bus and a communication bus extending through the first and second bases.

15. The control system of claim 14, wherein the first module is a controller module that includes a processor operable to execute control programs, and wherein the second module is an input/output (I/O) module that includes circuitry for processing and conditioning field inputs received from the field devices or control outputs received from the controller module.

\* \* \* \* \*